United States Patent [19]
Osler et al.

[11] Patent Number: 6,023,567
[45] Date of Patent: *Feb. 8, 2000

[54] METHOD AND APPARATUS FOR VERIFYING TIMING RULES FOR AN INTEGRATED CIRCUIT DESIGN

[75] Inventors: Peter James Osler, Jericho; Tad Jeffrey Wilder, So. Hero; Charles Barry Winn, Colchester, all of Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/726,589

[22] Filed: Oct. 7, 1996

[51] Int. Cl.⁷ .................................................. G06F 17/50
[52] U.S. Cl. ............................. 395/500.07; 395/500.04
[58] Field of Search ..................... 364/488, 489, 364/490, 491

[56] References Cited

U.S. PATENT DOCUMENTS

| | | | |
|---|---|---|---|
| 4,827,428 | 5/1989 | Dunlop et al. | 364/491 |
| 4,924,430 | 5/1990 | Zasio et al. | 364/578 |
| 5,095,454 | 3/1992 | Huang | 364/578 |
| 5,210,700 | 5/1993 | Tom | 364/489 |
| 5,239,493 | 8/1993 | Sherman | 364/578 |
| 5,305,229 | 4/1994 | Dhar | 364/489 |
| 5,323,401 | 6/1994 | Maston | 371/27 |
| 5,355,321 | 10/1994 | Grodstein et al. | 364/489 |
| 5,392,227 | 2/1995 | Hiserote | 364/578 |
| 5,394,346 | 2/1995 | Milsom | 364/578 |
| 5,452,225 | 9/1995 | Hammer | 364/488 |
| 5,463,563 | 10/1995 | Bair et al. | 364/490 |
| 5,491,640 | 2/1996 | Sharma et al. | 364/488 |
| 5,493,507 | 2/1996 | Shinde et al. | 364/489 |
| 5,544,066 | 8/1996 | Rostoker et al. | 364/489 |
| 5,555,201 | 9/1996 | Dangelo | 364/488 |
| 5,572,437 | 11/1996 | Rostoker et al. | 364/489 |
| 5,648,909 | 7/1997 | Biro et al. | 364/488 |
| 5,650,947 | 7/1997 | Okumura | 364/578 |
| 5,657,239 | 8/1997 | Grodstein et al. | 364/488 |

FOREIGN PATENT DOCUMENTS

| | | |
|---|---|---|
| 2108538 | 10/1994 | Canada . |
| 4-165573 | 6/1992 | Japan . |

*Primary Examiner*—Kevin J. Teska
*Assistant Examiner*—Thuan Do
*Attorney, Agent, or Firm*—McGinn & Gibb, P.C.; Richard M. Kotulak, Esq.

[57] ABSTRACT

An automated process for timing rule verification for an integrated circuit design is disclosed. The process includes the step of checking the generated timing rules by comparing a given timing rule against a synthesized model to determine timing relationships in the model that are not included in the timing rule and timing relationships in the timing rule that are not present in the model.

26 Claims, 3 Drawing Sheets

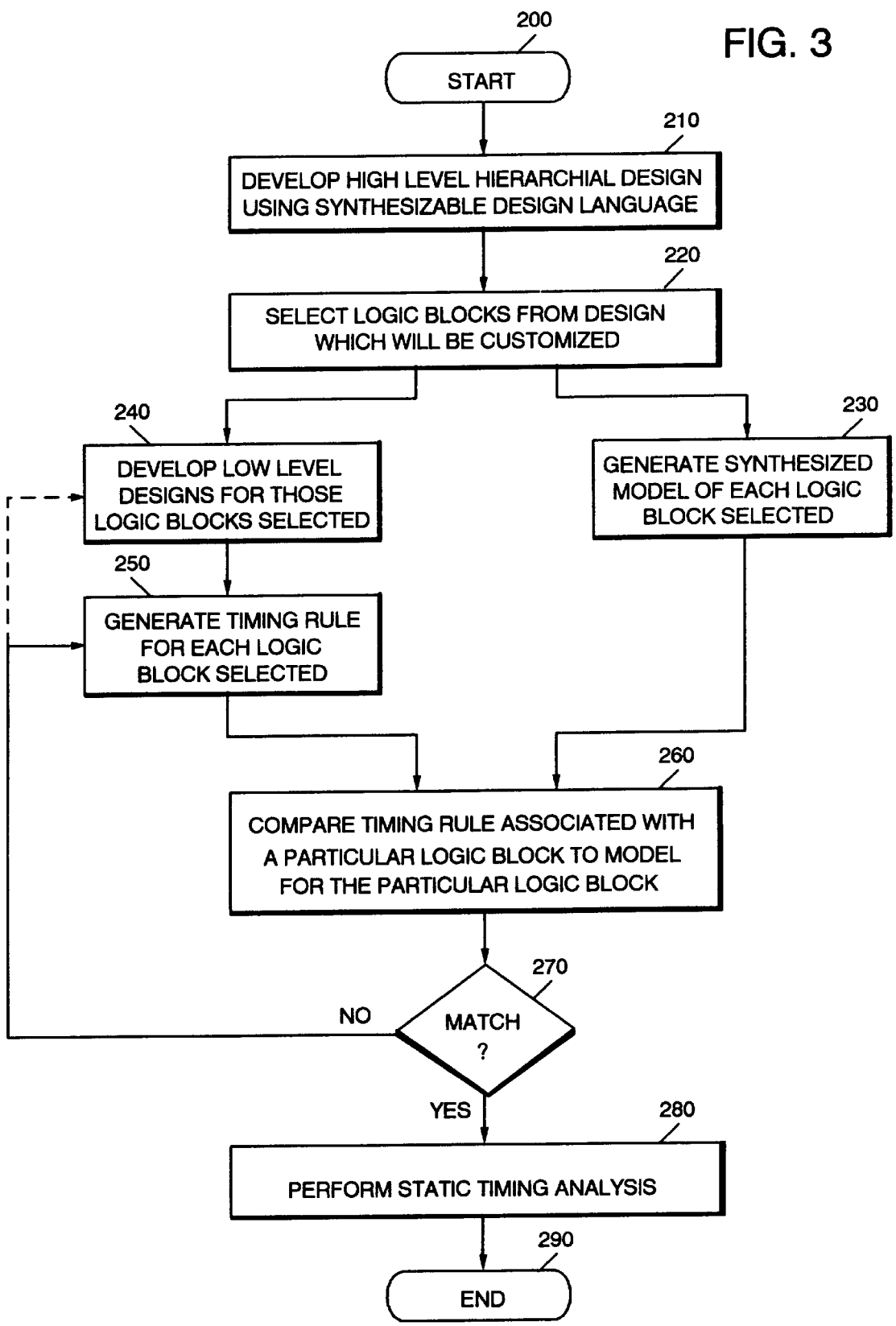

METHOD AND APPARATUS FOR VERIFYING TIMING RULES FOR AN INTEGRATED CIRCUIT DESIGN

FIELD OF THE INVENTION

The present invention relates, in general, to the design of integrated circuits and, more particularly, to methods for verifying timing rules used to analyze the cause and effect relationships within an integrated circuit to determine if certain timing criteria such as minimum setup and hold times have been violated.

BACKGROUND OF THE INVENTION

In the process of creating a large integrated circuit chip design, it is quite useful and customary to partition the logic into manageable pieces and to design hierarchically. This modularity maximizes reuse and simplifies the design. Some of the design pieces or blocks might be custom designed, while others could simply be synthesized ASIC (Application Specific Integrated Circuit) blocks. If the design is to be processed by a timing analysis tool, such as a static timing analyzer, there must at least be timing information for each of the lowest level building blocks of the design. Timing information about these blocks is presented to the timing analysis tool in the form of timing rules.

There currently exist static timing analysis tools, which are commonly made available by vendors of CAE stations and software, for timing analysis. Timing analysis is performed by software which analyzes the timing relationships between logic state changes within a circuit and determines if certain timing criteria such as minimum setup and hold times have been violated. A static timing analyzer does not attempt to model the circuit as it would operate but rather attempts to analyze a circuit's temporal behavior.

Timing rules for custom design blocks are usually generated via automatic program (such as Pathmill by EPIC), by hand, or some combination of the two. The problem is that the process is error prone, since rule generation programs rely on determining circuit temporal behavior based on a sometimes faulty set of heuristics, and manual generation suffers from all the problems associated with human intervention. Therefore, the timing rule must be checked to be sure that all of the required timing relationships, such as the correct propagation paths and setup and hold tests, exist in the rule, with no unnecessary additions. Results of missing timing relationships can be disastrous. Excess timing relationships cause additional problems. Checking many large, complicated rules by hand is not a reasonable option. Thus, what is needed is a computer implemented method for verifying timing rules for an integrated circuit design.

SUMMARY OF THE INVENTION

It is the object of the present invention to provide a method and apparatus for automatic verification of timing rules for an integrated circuit design. According to the invention, a method of designing an integrated circuit is provided which includes the steps of selecting a plurality of logic blocks to be included in a circuit, and carrying out a timing analysis on the circuit utilizing timing rules verified by 1) generating a timing rule for each of the plurality of logic blocks, and 2) checking the generated timing rules by comparing a timing rule associated with a particular logic block against a synthesized model of the particular logic block to determine timing relationships in the model that are not included in the particular timing rule and timing relationships in the particular timing rule that are not present in the model.

The present invention also includes a computer implemented method implementing the method steps set forth above.

The present invention provides the advantage of a systematic and automatic verification of timing rules utilized in designing an integrated circuit.

The present invention provides the advantage of eliminating the errors caused by automatic program or hand checking or verification of timing rules.

BRIEF DESCRIPTION OF THE DRAWINGS

FIG. 3 is a block diagram illustrating a method according to the present invention.

DETAILED DESCRIPTION OF A PREFERRED EMBODIMENT OF THE INVENTION

Figure 1:
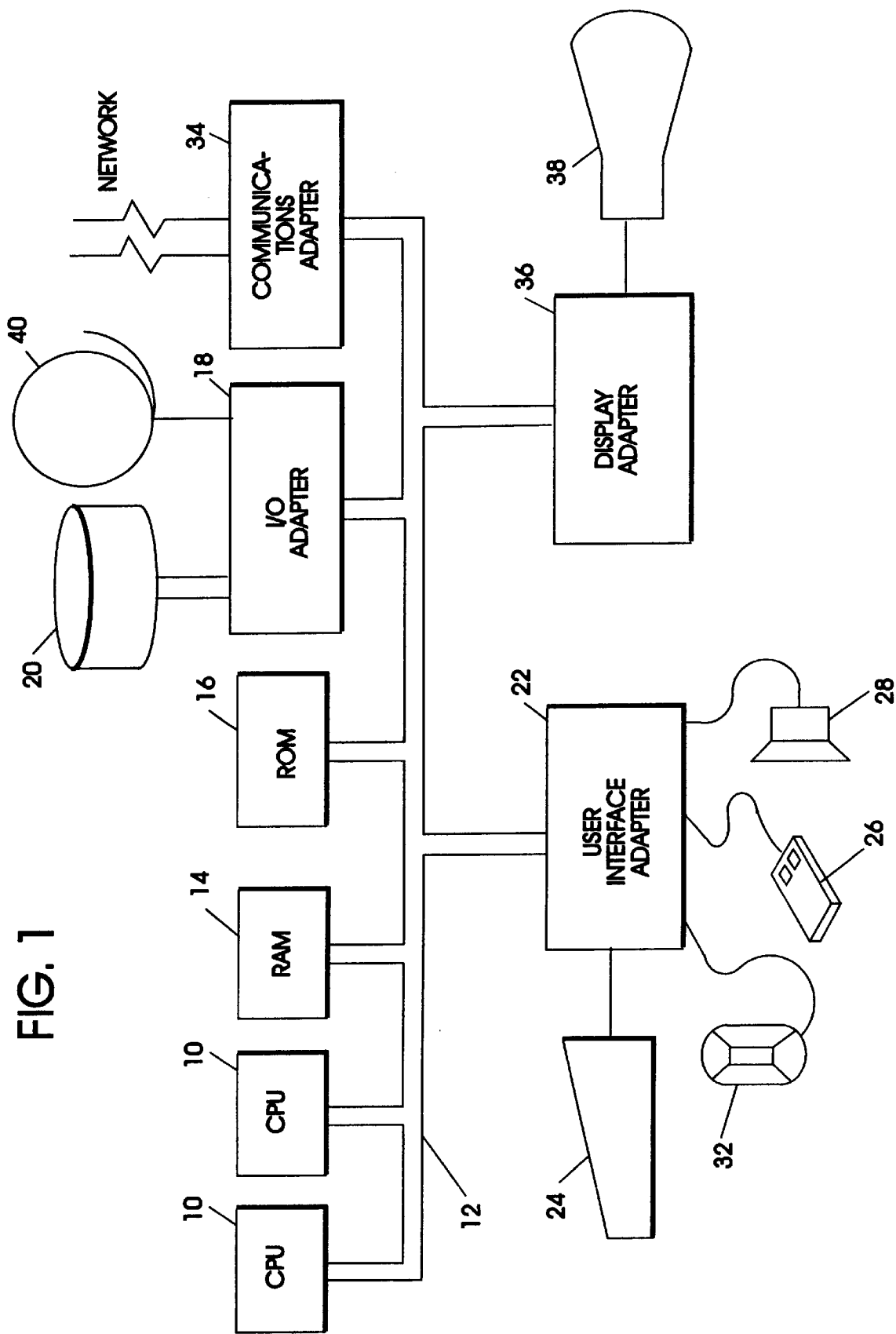
FIG. 1 is an information handling/computer system embodying the present invention.

A representative hardware environment for practicing the present invention is depicted in FIG. 1, which illustrates the typical hardware configuration of an information handling/computer system in accordance with the subject invention having at least one processor or central processing unit (CPU) 10. CPUs 10 are interconnected via system bus 12 to a random access memory (RAM) 14, read-only memory (ROM) 16, an input/output (I/O) adapter 18 for connecting peripheral devices such as disk units 20 and tape drives 40 to bus 12, user interface adapter 22 for connecting keyboard 24, mouse 26, speaker 28, microphone 32, and/or other user interface devices such as touch screen device (not shown) to bus 12, communication adapter 34 for connecting the information handling system to a data processing network, and display adapter 36 for connecting bus 12 to display device 38.

Figure 2:
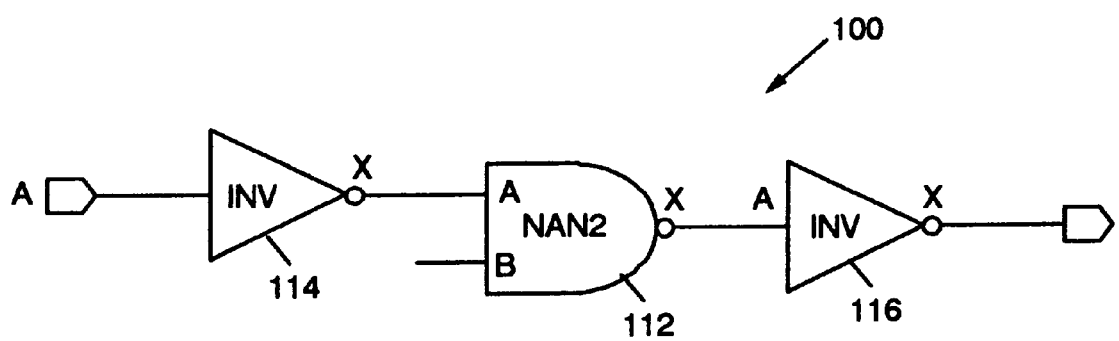
FIG. 2 schematically depicts a representative set of cells or logic blocks utilized in designing an integrated circuit according to the present invention.

FIG. 2 schematically depicts a set of logic cells or logic blocks 100, including exemplary logic block 112 for which it is desired to accurately verify the timing rule. Logic block 112 is a NAND block comprising a pair of input pins A, B and an output pin X. A driving block 114 is connected to the input side of block 112, and a driven block 116 is connected to the output side. Both the driving block 114 and the driven block 116 are inverters which have input pin A and output pin X. Blocks 100 and the particular type of block 112 are given by way of example only and are in no sense limiting; rather, the present methodology is designed to provide accurate timing rule verification for any size and type of logic block, including blocks consisting of lower level building blocks.

In one aspect, the invention is embodied in a process for designing and/or designing and fabricating integrated circuits. The steps of this process are illustrated in the Flow Chart of FIG. 3. The design process begins with step 200. In step 210, a high level hierarchical integrated circuit design is developed using a synthesizable high level design language such as VHDL or VERILOG as standardized by I.E.E.E. "Synthesizable" means being able to translate the high level design language into logic gates or blocks using a logic synthesizer. Next, in step 220, those logic blocks which will be custom designed are selected or separated from non-custom design blocks. "Custom" means currently unavailable designs needed, for example, to increase speed of operation. The custom logic blocks selected are passed to steps 230 and 240. It is to be understood that although the preferred embodiment of the present invention is used for verifying timing rules developed for a custom design, the method of the present invention may also be used to verify the timing rules of a non-customized and synthesizable section of the hierarchical design, in which case step 240 need not be performed and would be bypassed. It is also to be noted that the present invention is not limited to developing or designing a hierarchical design and may include verifying the timing rules of a new design for a single block, such as an AND gate. By way of example, the timing rules developed for a newly designed AND gate may be compared against a synthesized model of an AND gate having an associated circuit library with known good timing rules. In step 230, digital models of those logic blocks selected to be customized are generated. In other words, the high level design language for the blocks selected is translated into logic gates or blocks having an associated circuit library with known good timing rules. For example, a known good timing rule for a particular circuit block in a circuit library may consist of all possible propagation paths in a particular block, each setup and hold time test for the block, and specific values for setup, hold and delay times for the block. Now in step 240, low level designs (at the transistor level, for example) are developed for those logic blocks selected to be customized.

In step 250, a timing rule for a particular logic block from step 240 is generated using an automatic program such as Pathmill by EPIC, by hand, or some combination of the two. Next, in step 260, the timing rule for the particular logic block from step 250 is compared to the temporal behavior of the synthesized model generated in step 230. It is preferred that in this step, timing values are not compared, but instead, propagation paths are compared as well as setup and hold tests. However, it is to be understood that timing values may be compared to verify a timing rule. If it is determined, in step 270, that the timing rule for the custom logic block is identical to the timing rule for the non-custom synthesized version of the logic block, i.e., all of the propagation paths, setup and hold timing tests match, then a static timing analysis of the individual custom logic block or any combination of the logic blocks is performed, in step 270, to eventually check all possible timing implications/relationships through all circuit points. In step 270, a determination of the timing relationship, such as propagation paths or setup and hold timing tests in the model that are not included in the timing rule developed for the custom block and timing relationships in the timing rule for the custom block that are not present in the model is made. If a mismatch occurs, as determined in step 270, the low level design of the custom block performed in step 240 is modified if the design was faulty or the timing rule for the block generated in step 250 is modified. After modification, the timing rules are again compared in step 260 to determine if any mismatches are present. The timing rule for each custom block, generated in step 250, is compared to its corresponding model of the block generated in step 230 and modified, if necessary, in a similar fashion. The process is completed in step 290.

The method of the present invention is preferably implemented by a computer system, such as illustrated in FIG. 1, from a program storage device readable by the computer system. The program storage device tangibly embodies a program of instructions executed by the computer system to perform the process set forth above for verifying timing rules for an integrated circuit design. The program storage device could be RAM 14, ROM 16, disk units 20, tape drives 40, floppy disks, hard disks, compact discs or the like.

Although the present invention and its advantages have been described in detail, it should be understood that various changes, substitutions and alterations can be made herein without departing from the spirit or scope of the invention as defined in the appended claims.

What is claimed is:

1. A method of verifying timing rules for logic blocks of a circuit, said method comprising:

synthesizing a model for a logic block of said logic blocks based on requirements of a high-level design language and first timing rules within a circuit library, said first timing rules comprising known timing rules;

supplying second timing rules for said logic block; and comparing said model and said second timing rules to verify said second timing rules.

2. The method in claim 1, wherein said timing relationships comprise at least one of propagation paths, setup timing values and hold timing values.

3. The method in claim 1, wherein said logic block comprises a transistor-level element of said circuit.

4. The method in claim 1, further comprising determining whether said circuit satisfies design timing constraints using timing rules which have consistent timing relationships with said model.

5. The method in claim 1, wherein said second timing rules comprise timing rules for custom logic blocks unique to said circuit.

6. The method in claim 1, wherein said supplying of said second timing rules comprises generating said second timing rules for said logic block using at least one of an automated program and a manual method.

7. The method in claim 1 further comprising, if said comparing does not verify said second timing rules, supplying third timing rules and comparing said model and said third timing rules to verify said third timing rules.

8. A method of designing a circuit comprising:

supplying logical requirements and timing constraints for said circuit;

dividing said circuit into logic blocks using said logical requirements;

separating said logic blocks into standard logic blocks and custom logic blocks;

referencing a circuit library to retrieve standard timing rules for said standard logic blocks;

generating custom timing rules for said custom logic blocks;

synthesizing custom models for said custom logic blocks based on said logical requirements and first timing rules with said circuit library, said first timing rules comprising known timing rules;

comparing said model and second timing rules to verify said second timing rules;

repeating said generating and said comparing until said customized timing rules have consistent timing relationships with said customized models;

analyzing said circuit using said standard timing rules and said custom timing rules to produce a timing value for said circuit;

comparing said timing value with said timing constraints; and repeating said dividing, separating, referencing, generating, synthesizing, comparing of said model and said second timing rules, repeating, analyzing and comparing of said timing value with said timing constraints until said timing value is within said timing constraint.

9. The method in claim 8, wherein said timing relationships comprise at least one of propagation paths, setup timing values and hold timing values.

10. The method in claim 8, wherein said logic block comprises a transistor-level element of said circuit.

11. The method in claim 8, wherein said custom logic blocks are unique to said circuit.

12. The method in claim 8, wherein said generating custom timing rules comprises using at least one of an automated program and a manual method.

13. A computer system for verifying timing rules for logic blocks of a circuit, said computer system comprising:

a unit for synthesizing a model for a logic block of said logic blocks, based on requirements of a high-level design language and first timing rules within a circuit library;

a unit for supplying second timing rules for said logic block; and a unit for comparing said model and said second timing rules to verify said second timing rules.

14. The computer system in claim 13, wherein said timing relationships comprise at least one of propagation paths, setup timing values and hold timing values.

15. The computer system in claim 13, wherein said logic block comprises a transistor-level element of said circuit.

16. The computer system in claim 13, further comprising a unit for determining whether said circuit satisfies design timing constraints using timing rules which have consistent timing relationships with said model.

17. The computer system in claim 13, wherein said second timing rules comprise timing rules for custom logic blocks unique to said circuit.

18. The computer system in claim 13, wherein said unit for supplying second timing rules comprises a unit for generating timing rules for said logic block using at least one of an automated program and a manual method.

19. The computer system in claim 13, further comprising, if said comparing does not verify said second timing rules, a unit for supplying third timing rules and a unit for comparing said model and said third timing rules to verify said third timing rules.

20. A computer program product comprising a program storage device readable by a computer system tangibly embodying a program of instructions executed by said computer system to perform a process for verifying timing rules for logic blocks of a circuit, said process comprising:

synthesizing a model for a logic block of said logic blocks based on requirements of a high-level design language and first timing rules within a circuit library, said first timing rules comprising known timing rules;

supplying second timing rules for said logic block; and comparing said model and said second timing rules to verify said second timing rules.

21. The computer program product in claim 20, wherein said timing relationships comprise at least one of propagation paths, setup timing values and hold timing values.

22. The computer program product in claim 20, wherein said logic block comprises a transistor-level element of said circuit.

23. The computer program product in claim 20, further comprising determining whether said circuit satisfies design timing constraints using timing rules which have consistent timing relationships with said model.

24. The computer program product in claim 20, wherein said second timing rules comprise timing rules for custom logic blocks unique to said circuit.

25. The computer program product in claim 20, wherein said supplying second timing rules comprises generating timing rules for said logic block using at least one of an automated program and a manual method.

26. The computer program product in claim 20, wherein said process further comprises, if said comparing does not verify said second timing rules, supplying third timing rules and comparing said model and said third timing rules to verify said third timing rules.

\* \* \* \* \*